(12) United States Patent
Ishikawa

(10) Patent No.: US 6,319,847 B1
(45) Date of Patent: *Nov. 20, 2001

(54) SEMICONDUCTOR DEVICE USING A THERMAL TREATMENT OF THE DEVICE IN A PRESSURIZED STEAM AMBIENT AS A PLANARIZATION TECHNIQUE

(75) Inventor: Hiraku Ishikawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/050,561

(22) Filed: Mar. 30, 1998

(30) Foreign Application Priority Data

Mar. 31, 1997 (JP) .................................... 9-079498

(51) Int. Cl.⁷ ........................ H01L 21/31; H01L 21/469
(52) U.S. Cl. ......................................... 438/760; 438/783
(58) Field of Search .......................... 438/216, 287, 438/760, 783, 598

(56) References Cited

U.S. PATENT DOCUMENTS

| | | | |
|---|---|---|---|
| 4,420,503 | * | 12/1983 | Leung et al. . |
| 4,455,325 | * | 6/1984 | Razouk . |
| 5,409,858 | * | 4/1995 | Thakur et al. . |
| 5,679,610 | * | 10/1997 | Matsuda et al. . |
| 5,801,076 | * | 9/1998 | Ghneim et al. . |

FOREIGN PATENT DOCUMENTS

| | | |
|---|---|---|
| 4-56221 | 2/1992 | (JP) . |
| 6-69354 | 3/1994 | (JP) . |
| 7-37879 | 2/1995 | (JP) . |

OTHER PUBLICATIONS

Whitwer et al. ("Premetal Planarization Using Spin–On–Dielectric"; VMIC Conference, Jun. 12–13, 1989, pp. 96–102.*

Wolf et al. ("Silicon Processing: for the VLSI Era"; vol. 2, pp. 229–236), 1990.*

* cited by examiner

Primary Examiner—John F. Niebling
Assistant Examiner—Ron Pompey
(74) Attorney, Agent, or Firm—Hutchins, Wheeler & Dittmar

(57) ABSTRACT

A method for manufacturing a semiconductor device comprises forming a silicon nitride film, a BPSG film, and a SOG silicon oxide film containing boron or phosphorous on a transistor element, thermally treating the resultant wafer in a pressurized steam ambient, and thermally treating the wafer in an inactive gas ambient. The first thermal treatment causes hydrolysis of the SOG film to form a gel state of the SOG film, whereas the second thermal treatment hardens the SOG film by removing $H_2O$ content in the SOG film. The phosphorous or boron in the SOG film weakens the bonds in —Si—O—Si— chains in the SOG film to assist the separation of the —Si—O—Si— chains and the planarization of the SOG film.

19 Claims, 7 Drawing Sheets

US 6,319,847 B1

SEMICONDUCTOR DEVICE USING A THERMAL TREATMENT OF THE DEVICE IN A PRESSURIZED STEAM AMBIENT AS A PLANARIZATION TECHNIQUE

BACKGROUND OF THE INVENTION (a) Field of the Invention

The present invention relates to a method for manufacturing a semiconductor device and, more particularly, to a technique for planarization of interlevel dielectric layer.

(b) Description of the Related Art

With the advance of higher integration and higher speed of semiconductor devices, each element in the device is formed of a finer pattern. The current photolithographic technique requires a higher degree of planarization or flatness of transistor elements and overlying interlevel dielectric films for achieving the finer pattern. Examples of current planarization techniques include chemical-mechanical polishing (CMP), which however raises fabrication costs of the semiconductor device and only achieves a limited profile depending on the pattern of the interlevel dielectric film to be polished.

Patent Publication JP-A-7-37879 proposes a planarization technique for a spin-on-glass (SOG) film, formed by spin-coating of silicon oxide onto a semiconductor substrate, by using a low-temperature reflow technique, after improving the quality of the SOG silicon oxide film to be equivalent to the quality of a BPSG (borophosphosilicate glass) film by using thermal oxidation of the SOG film in a steam ambient to remove impurities in the SOG film.

The proposed technique, however, involves hardening of the SOG film itself, which may impede an effective planarity thereof.

Literature "Three "Low Dt" Options for Planarizing the Pre-metal Dielectric on an Advanced Double Poly BiCMOS Process", on Journal of Electrochemical Society, 1992, presented by W. Dauksher et al. describes a planarization technique, wherein a BPSG film comprising boron and phosphorous and formed on a transistor element is thermally treated in a steam ambient to reflow the BPSG film for planarization.

The technique of the thermal treatment of the BPSG in the steam ambient requests a temperature as high as about 800° C. in the thermal treatment for obtaining a sufficient planarity because of the high melting point of the BPSG, which temperature may affect the nature of the diffused regions formed in the preceding steps to degrade the transistor characteristics.

SUMMARY OF THE INVENTION

It is therefore an object of the present invention to provide a new and effective planarization technique for an interlevel dielectric film in a semiconductor device.

The present invention provides a method for manufacturing a semiconductor device including the consecutive steps of forming consecutively on a semiconductor substrate a semiconductor element, a first insulating film, a second insulating film containing phosphorous and boron, and a spin-on-glass (SOG) third insulating film containing at least one of phosphorous and boron to thereby obtain a first wafer, thermal treating the first wafer in a pressurized steam ambient, thermal treating the first wafer in an inactive gas ambient, and forming an interconnect layer on the third insulating film.

In accordance with the present invention, the phosphorous or boron in the third insulating film functions for weakening the bonds in the third insulating film to facilitate the separation of the weakened bonds during the hydrolysis by the thermal treatment in the pressurized steam ambient, thereby assisting the planarization of the third insulating film. The thermal treatment in the inactive gas ambient hardens the third insulating film by removing the water content in the third insulating film incorporated during the precedent thermal oxidation.

The above and other objects, features and advantages of the present invention will be more apparent from the following description, referring to the accompanying drawings.

PREFERRED EMBODIMENT OF THE INVENTION

Figure 1A:
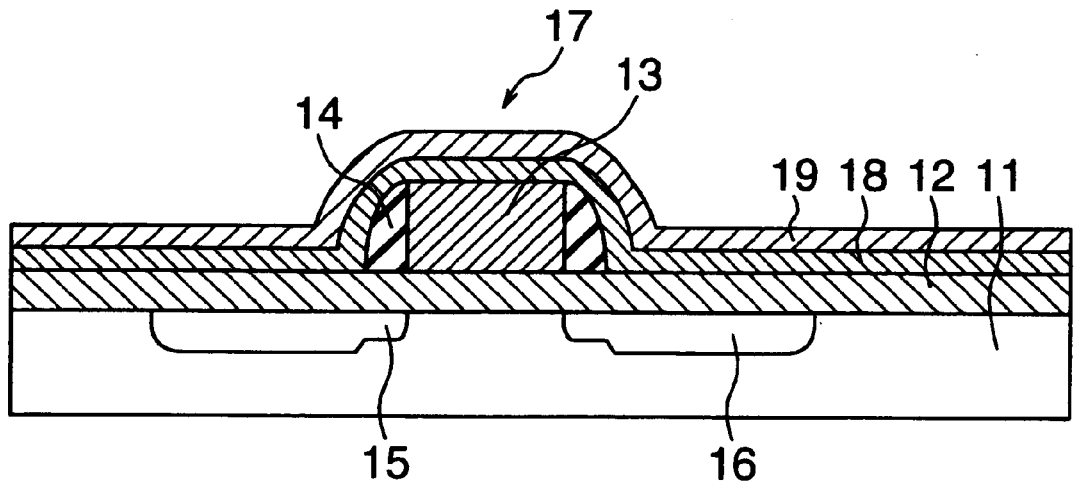
FIGS. 1A to 1E are cross-sectional views of a semiconductor device in consecutive steps for fabrication thereof according to an embodiment of the present invention.

Now, the present invention is more specifically described with reference to accompanying drawings, wherein similar constituent elements are designated by the same or related reference numerals.

FIGS. 1A to 1E show a semiconductor device in consecutive steps of fabrication thereof according to a first embodiment of the present invention. Referring to first FIG. 1A, a MOSFET 17 is formed on a silicon substrate 11, having a gate insulating film 12, gate electrode 13 associated with side wall films 14, and source/drain regions 16 associated with lightly doped drain (LDD) regions 15. A silicon oxide film 18 is then formed thereon by chemical vapor deposition (CVD) in a normal pressure ambient, followed by deposition of a silicon nitride film 19 thereon, which later functions as a protective layer for the transistor 17 against water or moisture. It is sufficient that the thickness of the silicon nitride film 19 be between 50 and 200 angstroms.

Figure 1B:
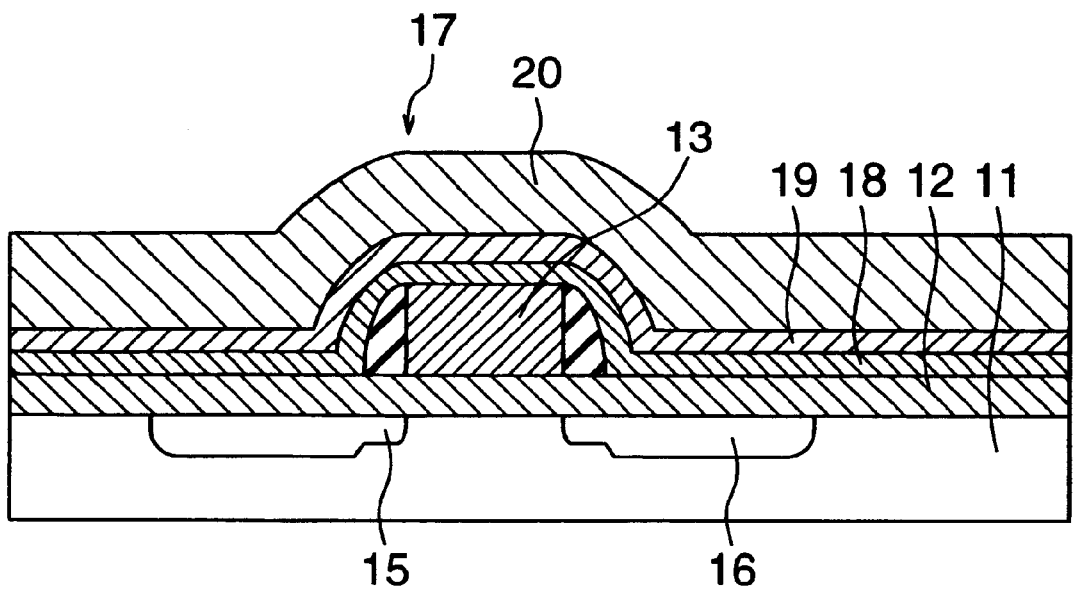
Figure 1C:
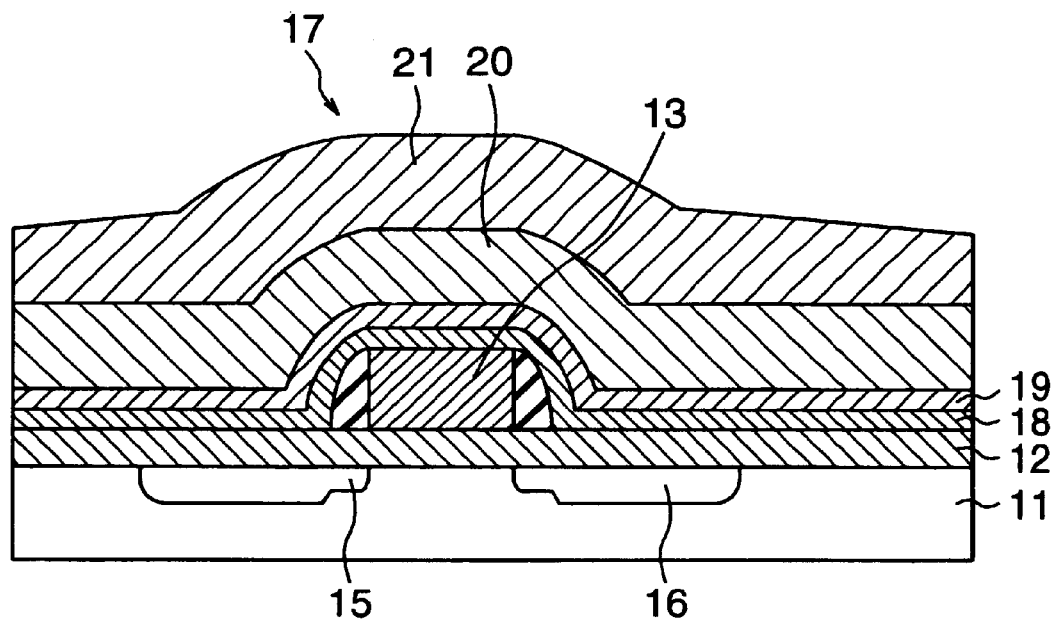

A BPSG film 20, which is made of silicon oxide comprising boron and phosphorous, having a suitable thickness is then formed on the silicon nitride film 19, as shown in FIG. 1B, followed by thermal treatment thereof at a suitable temperature for stabilization of the BPSG film 20. The thickness of the BPSG film 20 is selected based on the design of the semiconductor device. Subsequently, a SOG silicon oxide film 21 is formed on the BPSG film 20 by spin-coating, as shown in FIG. 1C. The SOG film 21 is made of silicon oxide comprising at least one of phosphorous and boron, which later functions for assisting the planarization. A thermal treatment is then conducted at a temperature between about 200° C. and about 300° C. in an inactive gas ambient such as a nitrogen or argon ambient for removing a solvent in the SOG film 21.

Figure 1D:
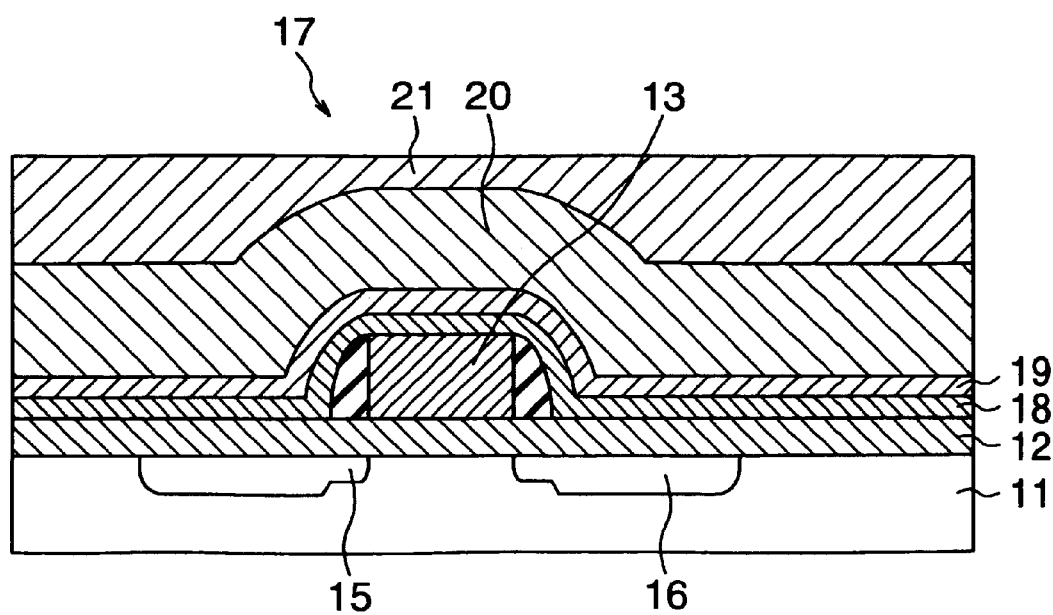

Subsequently, another thermal treatment is conducted to the resultant wafer in a pressurized steam ambient. The thermal treatment in the pressurized steam ambient causes hydrolysis of the SOG film 21, wherein a weak meshed structure of molecules comprising —Si—O—Si— chains in the SOG film 21 is separated by $H_2O$ molecules in the steam ambient to react with $H_2O$ molecules, forming molecules comprising —Si—OH chains and molecules comprising HO—Si— chains. The SOG film 21 thus separated from the meshed structure changes its state to a gel state having a plasticity. The phosphorous or boron in the SOG film 21 weakens the bonds in the —Si—O—Si— chains. Further, the high pressure applied to the gel SOG film 21 planarize the SOG film 21, as shown in FIG. 1D.

Figure 2:
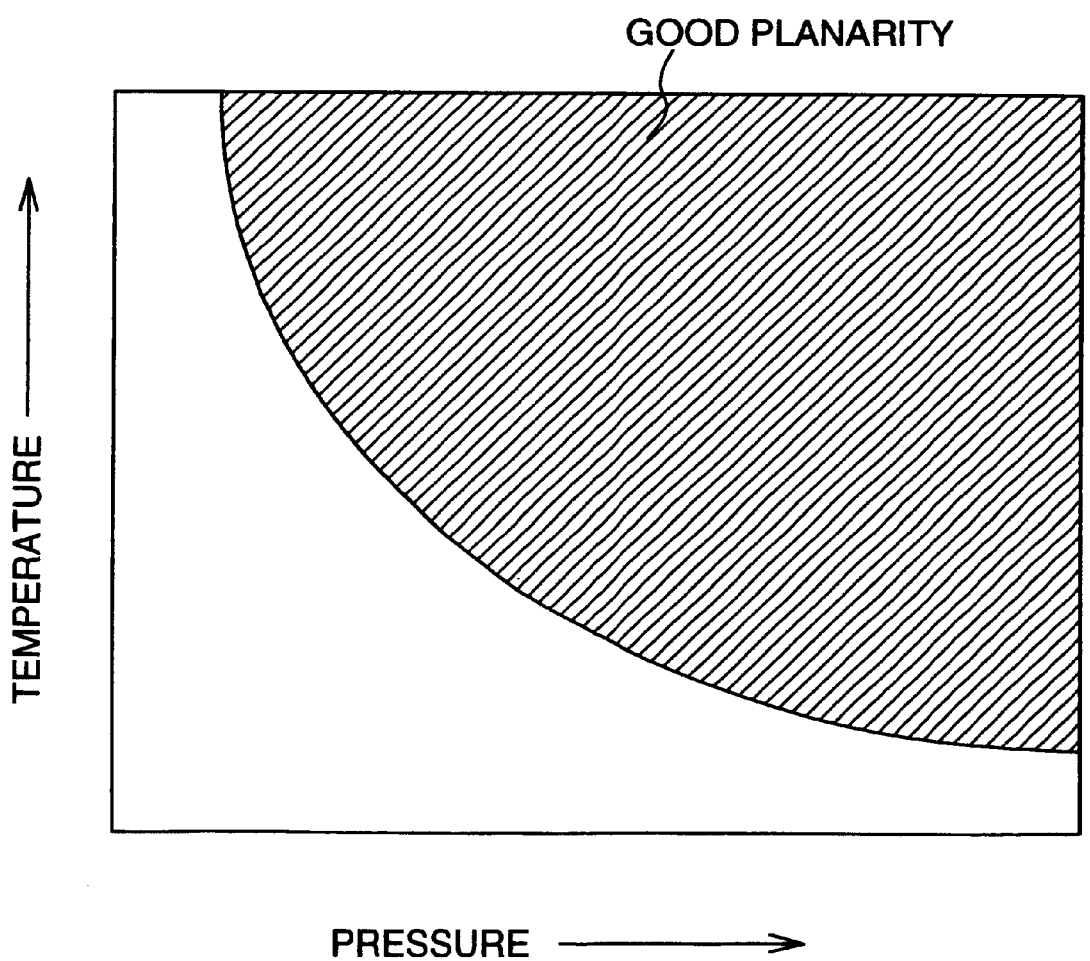
FIG. 2 is a graph for showing the relationship between the planarity and conditions of the thermal treatment including the treatment temperature and the ambient pressure.

FIG. 2 shows the relationship between the planarity of the SOG film and the conditions of the thermal treatment including the treatment temperature and the ambient pressure. In the drawing, the hatched region corresponds to the conditions allowing an excellent planarity of the SOG film 21 for satisfying the transistor characteristics in the resultant device. A higher pressure provides a suitable condition at a lower temperature for an excellent planarity, whereas a higher temperature must be applied at a lower pressure. In addition, a higher temperature provides a more suitable condition at a higher pressure.

Figure 1E:
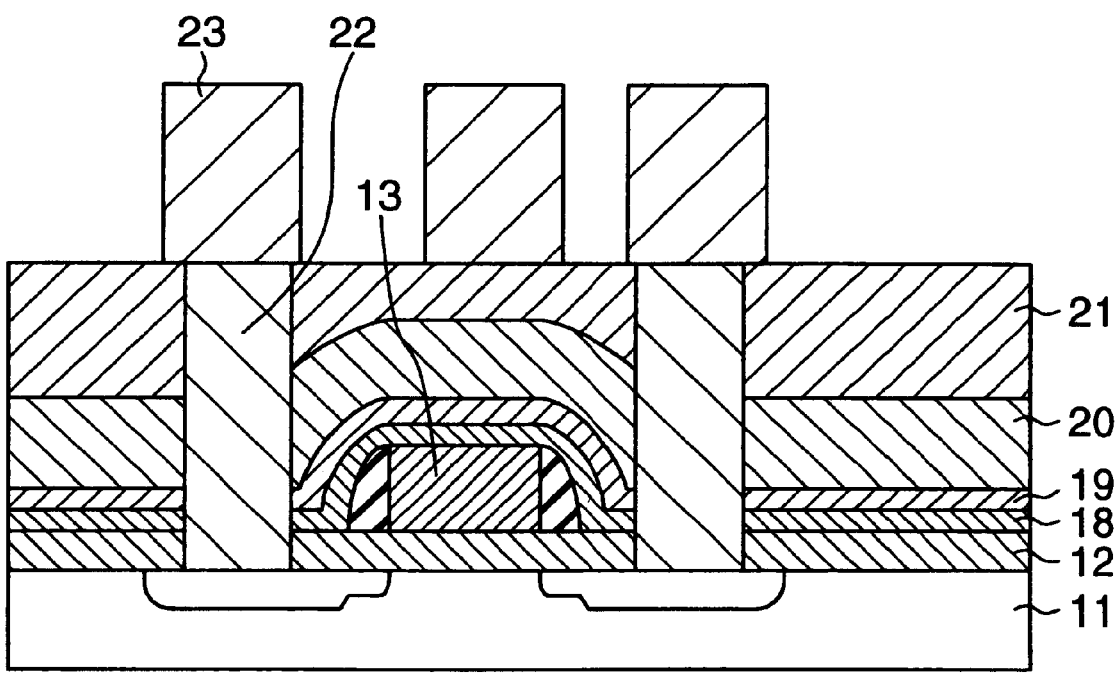

Thereafter, a pressurized inactive gas such as nitrogen gas is employed for the ambient of a further thermal treatment to harden the planarized SOG film. The treatment temperature may be equivalent to or higher than the temperature employed in the thermal treatment in the pressurized steam ambient, thereby substantially completely removing water content in the SOG film 21. After the thermal treatment in the inactive ambient, the thickness of the SOG film 21 (or SOG film 21/BPSG film 20) may be adjusted by an etch back step using a dry etching technique, for example. The planarized surface of the SOG film 21 allows an exact patterning during subsequent photolithographic steps for fabrication of metallic plugs 22 and metallic interconnects 13, such as shown in FIG. 1E.

Figure 3A:
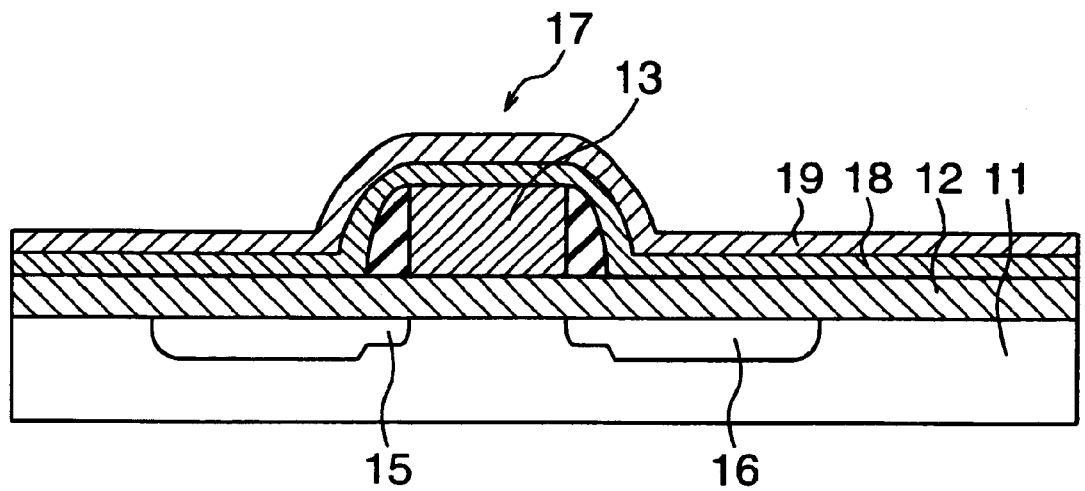
FIGS. 3A to 3E are cross-sectional views of a semiconductor device in consecutive steps for fabrication thereof according to a second embodiment of the present invention.
Figure 3B:
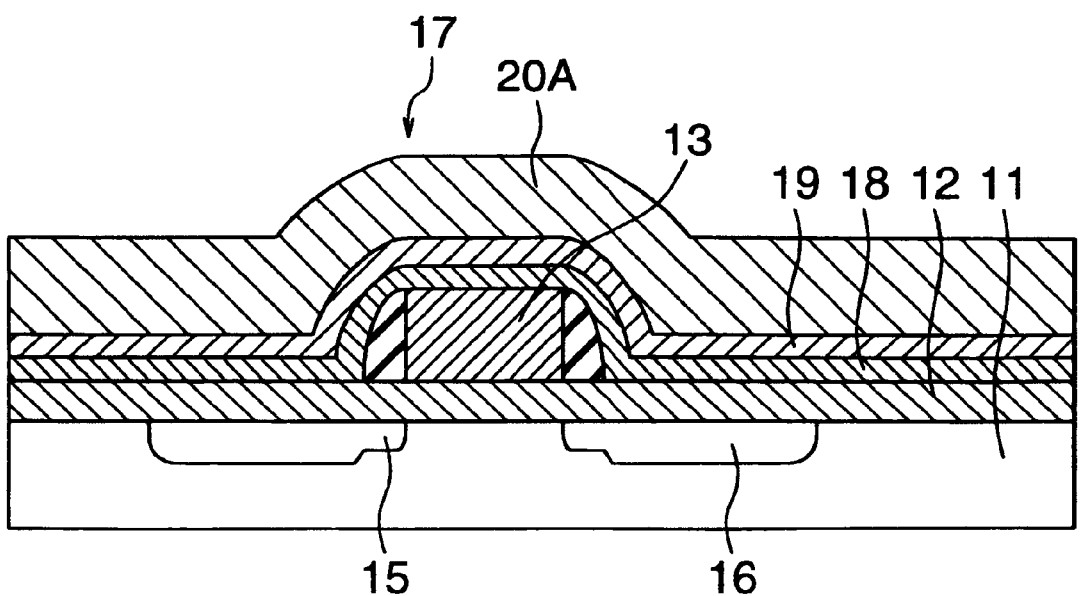
Figure 3C:
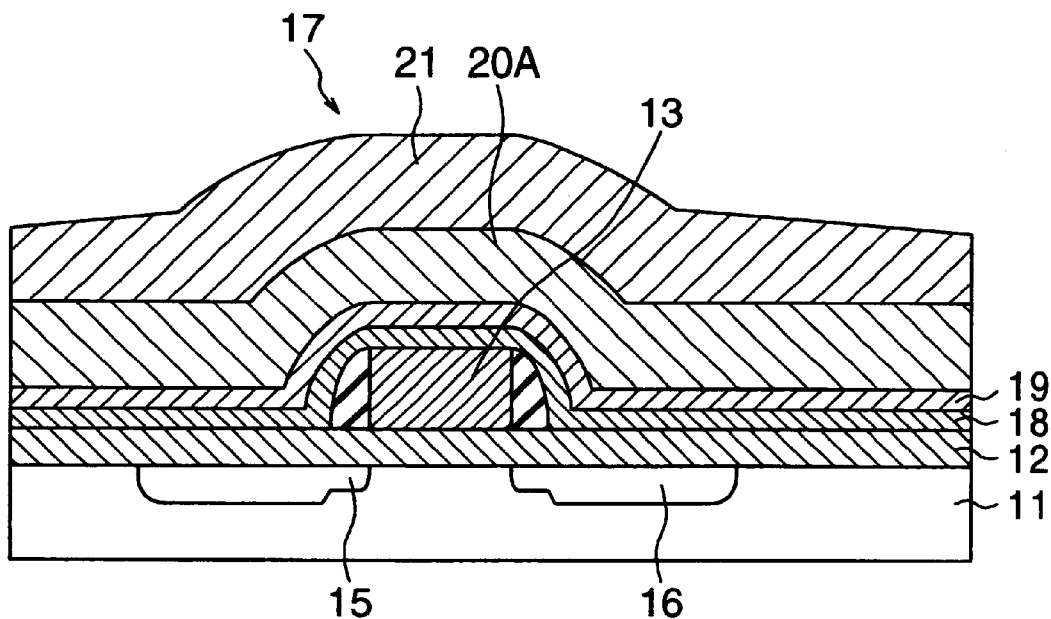
Figure 3D:
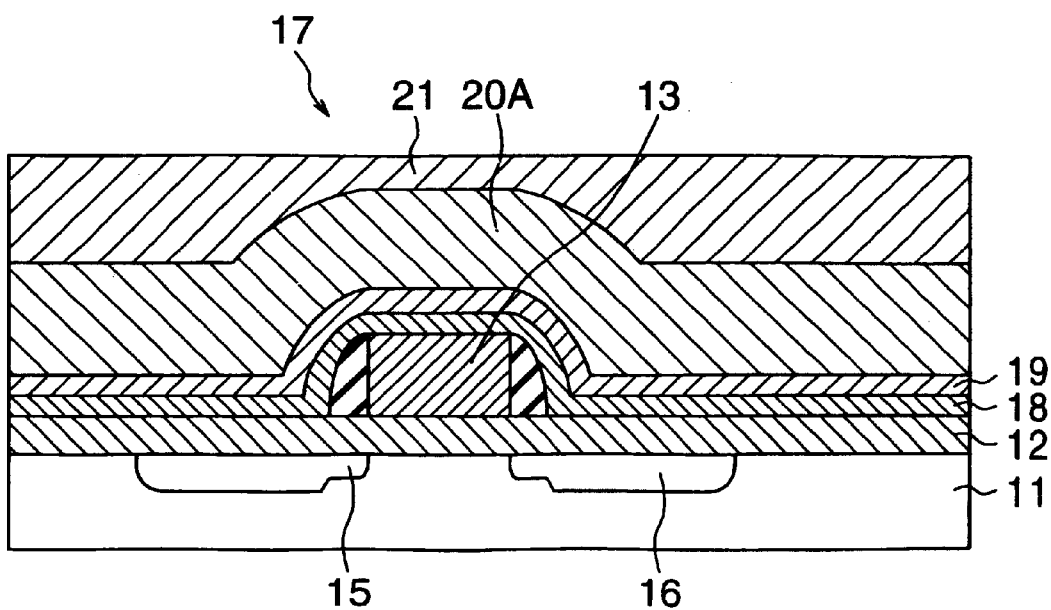
Figure 3E:
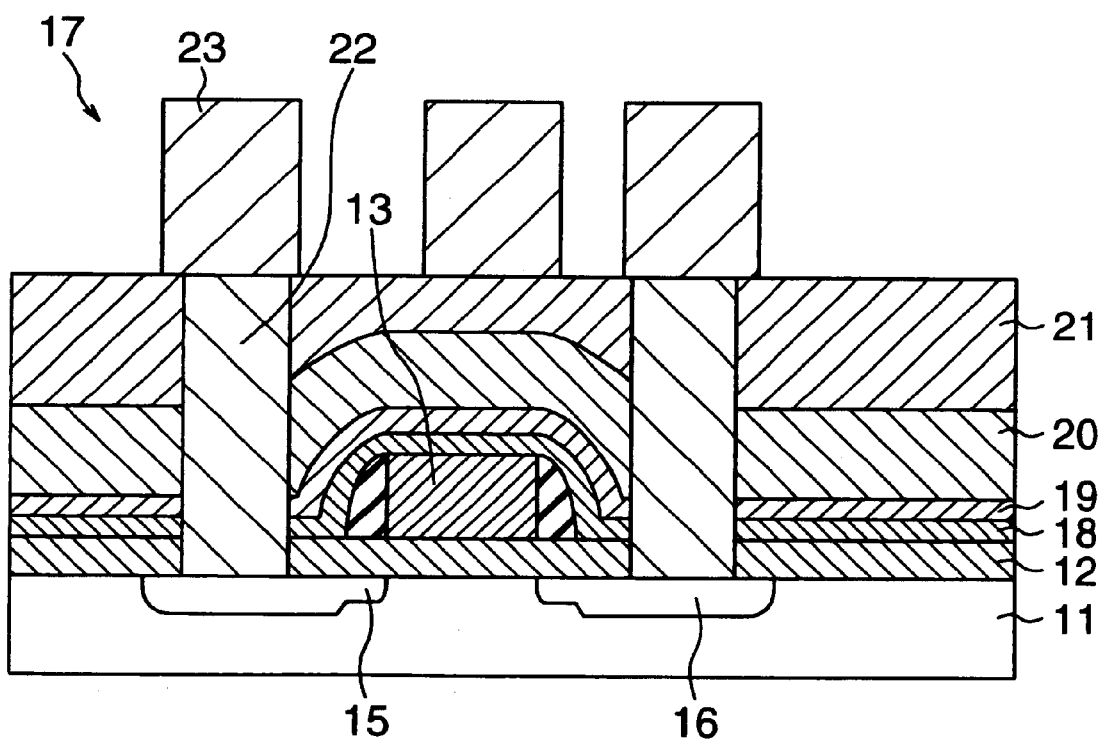

Referring to FIGS. 3A to 3E, there is shown a method for fabricating a semiconductor device according to a second embodiment of the present invention. In FIG. 3A, a MOS-FET 17 is formed similarly to the first embodiment, followed by CVD to form a silicon oxide film 18. A silicon nitride film 19 is then deposited thereon, followed by CVD to form another silicon oxide film 20A, as shown in FIG. 3B. The thickness of the silicon oxide film 20A is selected based on the design of the semiconductor device.

Thereafter, a SOG film 21 is formed on the silicon oxide film 20A by spin-coating, followed by a thermal treatment thereof in an inactive gas ambient such as nitrogen or argon gas at a temperature between about 200° C. and about 300° C., thereby removing a solvent in the SOG film 21. An implantation of phosphorous or boron ions is then conducted to the SOG film 21 for improving the planarization capability of the SOG film 21. The acceleration energy for the impurity ions is adjusted to obtain an impurity profile in the SOG film 21 wherein surface region of the SOG film 21 has a larger impurity concentration.

Subsequently, a thermal treatment is conducted, similarly to the second embodiment, in a pressurized steam ambient, thereby separating the meshed structure of molecules comprising —Si—O—Si— chains having a weak bond in the SOG film 21 to react with H$_2$O molecules by hydrolysis to form molecules comprising —Si—OH chains and molecules comprising HO—Si— chains. The separated SOG film 21 changes its state into a gel state having a plasticity. The phosphorous or boron ions in the SOG film 21 accelerates the change of the SOG film 21 into the gel state due to the weakened bonds in the —Si—O—Si— chains. In addition, the high pressure acting on the SOG film 21 itself accelerates planarization of the gel SOG film 21.

The thus planarized gel SOG film 21 is then hardened by a further thermal treatment in a pressurized inactive gas ambient such as a nitrogen or argon gas ambient. The temperature during the thermal treatment in the inactive ambient is equivalent to or higher than the precedent thermal treatment in the pressurized steam ambient, thereby substantially completely removing the water content in the SOG film 21. After the thermal treatments, an etch back process using a dry etching technique may be employed to adjust the thickness of the SOG film 21. The planarized SOG film 21 allows an exact patterning during subsequent photolithographic steps for fabrication of metallic plugs 22 and metallic interconnects 13, such as shown in FIG. 2E.

It was confirmed by experiments in the present invention that the pressure of the steam ambient or inactive gas ambient should be above about 5 atm, and that thermal treatment should be conducted at a temperature between 400° C. and 700° C. for about 1 to 2 hours for achieving a suitable throughput. The inactive gas may be nitrogen, one or more of rare gases such as argon, or a mixed gas of rare gas or rare gases and oxygen.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor device including the consecutive steps of forming consecutively on a semiconductor substrate a semiconductor element, a first insulating film, a second insulating film containing at least one of phosphorus and boron, and a cured spin-on-glass (SOG) third insulating film containing at least one of phosphorus and boron to thereby obtain a first wafer, thermal treating the first wafer in a pressurized steam ambient causing hydrolysis of at least a portion of the cured SOG third insulating film changing the portion of the SOG third insulating film to a gel state, thermal treating the first wafer in an inactive gas ambient to at least partially densify the portion of the SOG third insulating film, and forming an interconnect layer on the third insulating film.

2. A method as defined in claim 1, wherein the second insulating film is made of borophosphosilicate glass.

3. A method as defined in claim 1, wherein the third film is made of silicon oxide.

4. A method as defined in claim 1, wherein the first insulating film is made of silicon nitride.

5. A method as defined in claim 1, wherein the thermal treatment in the pressurized steam ambient is conducted at a pressure above 5 atm. and at a temperature between 400° C. and 700° C.

6. A method of manufacturing a semiconductor device, comprising:
   forming on the semiconductor device a cured spin-on-glass film containing at least one of: phosphorus and boron;
   changing at least a portion of the cured spin-on-glass film to a gel state by exposing the cured spin-on-glass film to an ambient pressurized steam causing hydrolysis of the portion of the cured spin-on-glass film to the gel state; and
   hardening the spin-on-glass film in an inactive gas ambient.

7. A method, according to claim 6, further comprising:
   prior to forming the spin-on-glass film, forming a semiconductor element on a substrate of the semiconductor device; and
   forming first and second insulating layers between the semiconductor element and the spin-on-glass film.

8. A method, according to claim 7, wherein the first insulating film is silicon nitride.

9. A method, according to claim 7, wherein the second insulating film is borophosphosilicate glass.

10. A method, according to claim 7, wherein the second insulating film is silicon oxide.

11. A method, according to claim 6, wherein the ambient pressurized steam is provided at a pressure above 5 atm. and at a temperature between 400 degrees centigrade and 700 degrees centigrade.

12. A method, according to claim 6, wherein hardening the spin-on-glass film includes subjecting the spin-on-glass film to ambient inert gas.

13. A method, according to claim 12, wherein the inert gas includes at least one of nitrogen, argon, and oxygen.

14. A semiconductor device, comprising:

a substrate;

a semiconductor element formed on said substrate; and a planarized insulating portion formed on said semiconductor element and including a cured spin-on-glass film with at least one of: phosphorus and boron, at least a portion of the cured spin-on-glass being first changed to a gel state by exposing the cured spin-on-glass film to an ambient pressurized steam causing hydrolysis of at least said portion of the spin-on-glass film to the gel state and then hardened the insulating portion in an inactive gas ambient.

15. A semiconductor device, according to claim 14, wherein said planarized insulating portion includes first and second insulating layers between said semiconductor element and said spin-on-glass film.

16. A semiconductor device, according to claim 15, wherein said first insulating film is silicon nitride.

17. A semiconductor device, according to claim 15, wherein said second insulating film is borophosphosilicate glass.

18. A semiconductor device, according to claim 15, wherein said second insulating film is silicon oxide.

19. A semiconductor device, according to claim 14, wherein said semiconductor element is a MOSFET.

* * * * *